United States Patent
Zhang

(10) Patent No.: US 11,280,352 B2
(45) Date of Patent: Mar. 22, 2022

(54) FAN COVER

(71) Applicant: SCHNEIDER ELECTRIC IT CORPORATION, Foxboro, MA (US)

(72) Inventor: Yanli Zhang, Shanghai (CN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 17 days.

(21) Appl. No.: 16/801,719

(22) Filed: Feb. 26, 2020

(65) Prior Publication Data

US 2020/0277969 A1   Sep. 3, 2020

(51) Int. Cl.
| | |
|---|---|
| F04D 29/70 | (2006.01) |
| F04D 29/42 | (2006.01) |
| H05K 7/20 | (2006.01) |
| F04D 29/54 | (2006.01) |
| F04D 25/08 | (2006.01) |
| F04D 25/06 | (2006.01) |

(52) U.S. Cl.
CPC ....... *F04D 29/703* (2013.01); *F04D 25/0613* (2013.01); *F04D 25/08* (2013.01); *F04D 29/4226* (2013.01); *F04D 29/544* (2013.01); *H05K 7/20172* (2013.01); *H05K 7/20736* (2013.01); *F05D 2250/191* (2013.01); *F05D 2250/25* (2013.01)

(58) Field of Classification Search
CPC .... F04D 29/522; F04D 29/542; F04D 29/544; F04D 29/4226; F04D 29/703; F05D 2250/25; F05D 2250/191
See application file for complete search history.

(56) References Cited

U.S. PATENT DOCUMENTS

| 4,603,271 A | 7/1986 | Maruyama et al. |
| 6,244,818 B1 * | 6/2001 | Chang ................. F01D 25/24 |
| | | 415/193 |

(Continued)

FOREIGN PATENT DOCUMENTS

| CN | 106224293 A | * 12/2016 |
| CN | 106837832 A | * 6/2017 |

(Continued)

OTHER PUBLICATIONS

Rutland Plastics, "Design for Assembly" accessed from https://www.rutlandplastics.co.uk/design-guidelines/design-for-assembly-2/ (Year: 2017).*

(Continued)

*Primary Examiner* — Topaz L. Elliott
(74) *Attorney, Agent, or Firm* — Lando & Anastasi, LLP

(57) ABSTRACT

A fan cover is configured to be mounted on a housing of a fan module. The fan cover includes a frame having an opening formed therein, a central hub positioned within the opening of the frame, and a plurality of spiral-shaped air guidance members that extend from the central hub to the frame. Gaps between the spiral-shaped air guidance members of the plurality of spiral-shaped air guidance members enable air to flow from the fan module through the fan cover. Each spiral-shaped air guidance member is configured to extend perpendicularly from the central hub and curve towards the frame at an angle with respect to the opening of the frame. Each spiral-shaped air guidance member further has a plurality of openings formed therein to facilitate air flow.

18 Claims, 9 Drawing Sheets

(56) References Cited

U.S. PATENT DOCUMENTS

| | | | |
|---|---|---|---|
| 8,182,218 B2* | 5/2012 | Pearce | F04D 29/544 |
| | | | 415/220 |
| 9,151,294 B2* | 10/2015 | Huang | F04D 29/542 |
| 9,790,959 B2* | 10/2017 | Briand | F04D 19/002 |
| 10,859,287 B2* | 12/2020 | Yamamoto | F04D 29/544 |
| 2003/0026691 A1 | 2/2003 | Huang et al. | |
| 2004/0101404 A1 | 5/2004 | Takemoto | |
| 2005/0019165 A1* | 1/2005 | Fujimori | F04D 29/666 |
| | | | 416/223 R |
| 2007/0286717 A1* | 12/2007 | Tseng | F04D 25/0606 |
| | | | 415/183 |
| 2008/0166232 A1* | 7/2008 | Pearce | F04D 29/703 |
| | | | 415/220 |
| 2009/0101315 A1 | 4/2009 | Cheng | |
| 2010/0119366 A1* | 5/2010 | Bushnell | F04D 29/544 |
| | | | 415/208.2 |
| 2013/0000493 A1 | 1/2013 | Watanabe et al. | |
| 2014/0023495 A1* | 1/2014 | Huang | F04D 29/705 |
| | | | 415/220 |
| 2015/0125287 A1* | 5/2015 | Briand | F04D 29/544 |
| | | | 415/208.2 |
| 2016/0108929 A1* | 4/2016 | Su | F04D 29/544 |
| | | | 415/177 |
| 2017/0009654 A1* | 1/2017 | Maier | F02C 7/18 |
| 2020/0208646 A1* | 7/2020 | Tokuno | F04D 29/38 |
| 2020/0208871 A1* | 7/2020 | Yamamoto | F24F 7/007 |
| 2021/0039767 A1* | 2/2021 | Paruchuri | B64C 9/22 |
| 2021/0062816 A1* | 3/2021 | Harman | F04D 19/002 |

FOREIGN PATENT DOCUMENTS

| | | | | |
|---|---|---|---|---|
| CN | 106930977 A | * | 7/2017 | |
| CN | 107339265 A | * | 11/2017 | |
| CN | 109340179 A | * | 2/2019 | F04D 29/544 |
| DE | 102008044505 A1 | * | 3/2010 | F04D 29/444 |
| RU | 169892 | * | 9/2017 | |
| WO | WO-2015094141 A2 | * | 6/2015 | F04D 29/544 |

OTHER PUBLICATIONS

Xia, X. Unsteady Aerodynamics and Trailing-edge Vortex Sheet of an Airfoil. 54th AIAA Aerospace Sciences Meeting. Jan. 4-8, 2016. (Year: 2016).*

Extended European Search Report from corresponding European Application No. 20159324.1 dated Jun. 25, 2020.

* cited by examiner

FAN COVER

CROSS-REFERENCE TO RELATED APPLICATION

This application claims the benefit under 35 U.S.C. § 119 of Chinese Patent Application No. 201910152107.0 filed Feb. 28, 2019 which is hereby incorporated herein by reference in its entirety for all purposes.

BACKGROUND

1. Field of Disclosure

The present disclosure relates generally to the cooling systems used in a data center environment, and more particularly to a cooling rack fan module having an improved fan cover configured to improve thermal cooling of the cooling system.

2. Discussion of Related Art

Equipment enclosures or racks for housing electronic equipment, such as data processing, networking and telecommunications equipment have been used for many years. Such racks are used to contain and to arrange the equipment in large data centers, as well as small wiring closets and equipment rooms. In certain embodiments, an equipment rack can be an open configuration and can be housed within a rack enclosure, although the enclosure may be included when referring to a rack. A standard rack typically includes front mounting rails to which multiple units of electronic equipment, such as servers, CPUs and telecommunication equipment, are mounted and stacked vertically within the rack. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

There is a continuous need to improve the performance of the cooling within such environments, including increasing energy efficiency and air flow rate. Fan modules are used to cool electronic equipment, including semiconductors, in combination with heat sinks. Such a fan module typically includes a bladed fan driven by a motor at high rotational speeds, and can be positioned within an electronics equipment rack behind a door of the equipment rack. Such fans are also used on cooling racks. FIGS. 1A-1C illustrate some well-known fan module configurations.

Such fan modules further include a fan cover to protect a person accessing the equipment rack from the high-speed rotating blades. Known fan covers include a grill fan cover, typically fabricated from metal or plastic, that is used to protect the person accessing the equipment rack from the fan blades. A shortcoming associated with most fan covers is that while the fan covers protect the person from placing fingers within the fan module, the fan cover blocks the flow of air generated by the bladed fan of the fan module. The openings can be increased but at the risk of failing to protect the person from the bladed fan of the fan module.

FIGS. 2A-2C, 3A-3C and 4A-4C illustrate known fan covers that can be employed within an equipment rack environment. As shown, FIGS. 2A-2C illustrate typical grille-type fan covers. FIGS. 3A-3C illustrate perforated-type fan covers. FIGS. 4A-4C illustrate a fan cover that is used on existing equipment racks.

SUMMARY OF DISCLOSURE

One aspect of the disclosure is directed to a fan cover configured to be mounted on a housing of a fan module. In one embodiment, the fan cover comprises a frame having an opening formed therein, a central hub positioned within the opening of the frame, and a plurality of spiral-shaped air guidance members that extend from the central hub to the frame. Gaps between the spiral-shaped air guidance members of the plurality of spiral-shaped air guidance members enable air to flow from the fan module through the fan cover.

Embodiments of the fan cover further may include a plurality of projections extending from the frame. The plurality of projections each are received within a corresponding aperture formed in the housing of the fan module to align and receive the fan cover to the fan module. The plurality of projections may include four projections. Each spiral-shaped air guidance member may extend perpendicularly from the central hub and curves towards the frame at an angle with respect to the opening of the frame. Each spiral-shaped air guidance member may project above a plane defined by the frame. The spiral-shaped air guidance member may be helical in construction. Each spiral-shaped air guidance member may have a plurality of openings formed therein. A diameter of the opening of the frame may be larger than a fan vent of the fan module, and a diameter of the central hub may be smaller than a diameter of a fan motor of the fan module. The fan cover may be fabricated from plastic material. Each spiral-shaped air guidance member may be shaped to approximate a fan blade of the fan module. The fan cover may be configured to make a thermal source cooler.

Another aspect of the present disclosure is directed to a fan module comprising a housing, an axial fan coupled to the housing, a motor coupled to the axial fan to drive a rotation of the axial fan, and a cover configured to be mounted on a housing of a fan module. In one embodiment, the fan cover includes a frame having an opening formed therein, the frame being configured to be secured to the housing, a central hub positioned within the opening of the frame, and a plurality of spiral-shaped air guidance members that extend from the central hub to the frame. Gaps between the spiral-shaped air guidance members of the plurality of spiral-shaped air guidance members enable air to flow from the fan module through the fan cover.

Embodiments of the fan module further may include a plurality of projections extending from the frame. The plurality of projections each are received within a corresponding aperture formed in the housing of the fan module to align and receive the fan cover to the fan module. The plurality of projections may include four projections. Each projection may include a shaft and a rivet head that is formed on the end of the shaft. Each spiral-shaped air guidance member may extend perpendicularly from the central hub and curves towards the frame at an angle with respect to the opening of the frame. Each spiral-shaped air guidance member may project above a plane defined by the frame. Each spiral-shaped air guidance member may have a plurality of openings formed therein. A diameter of the central hub is smaller than a diameter of the fan motor of the fan module.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

DETAILED DESCRIPTION

At least one embodiment of the present disclosure is directed a fan module having a fan cover that is used within equipment enclosures or racks of a data center. As used herein, "enclosures" and "racks" are used to describe apparatus designed to support electronic equipment. Data centers are typically large rooms designed, in certain instances, to house hundreds of electronic equipment racks arranged in rows within the data center. "Enclosures" and "racks" are further used to describe apparatus designed to support cooling equipment used to provide strategic cooling within the data center. In some embodiments, "enclosures" and "racks" can support electronic equipment and cooling equipment.

Figure 1A:
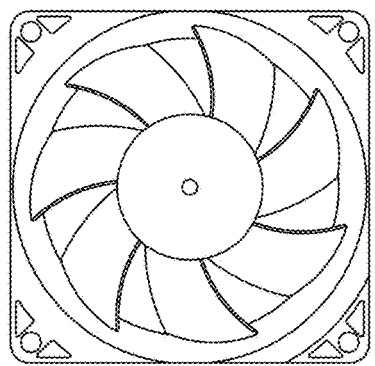
FIGS. 1A-1C are views of known fan module configurations.
Figure 1B:
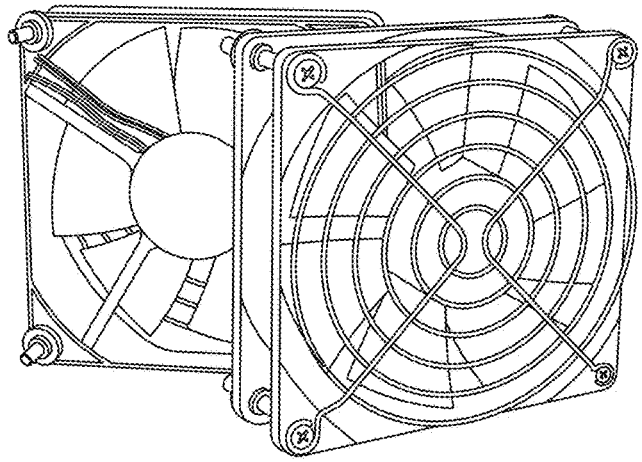
Figure 1C:
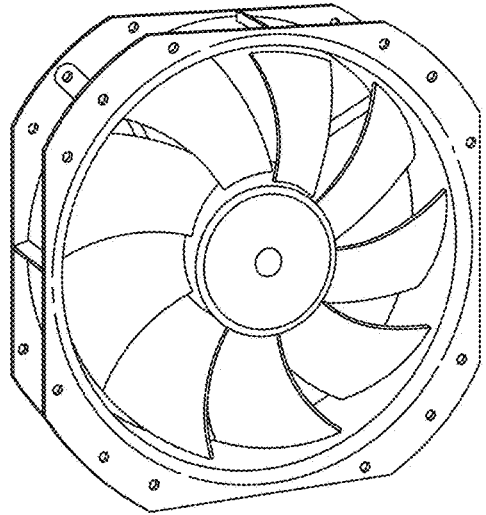
Figure 2A:
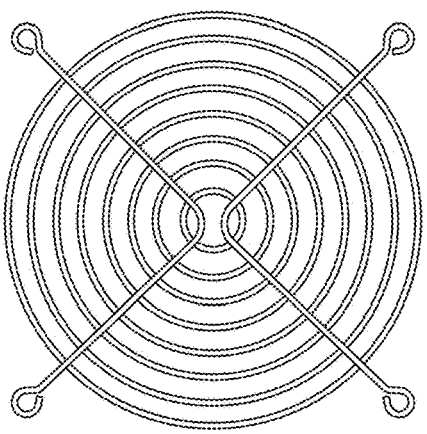
FIGS. 2A-2C are front views of known grille-type fan covers.
Figure 2B:
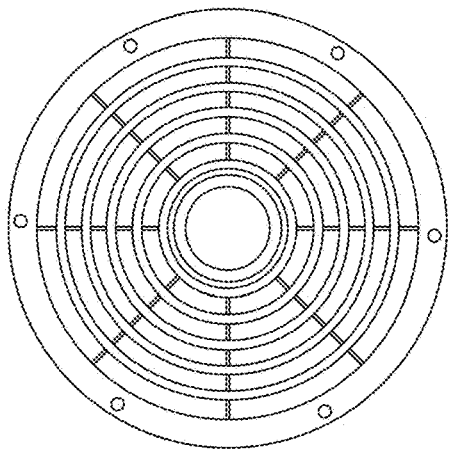
Figure 2C:
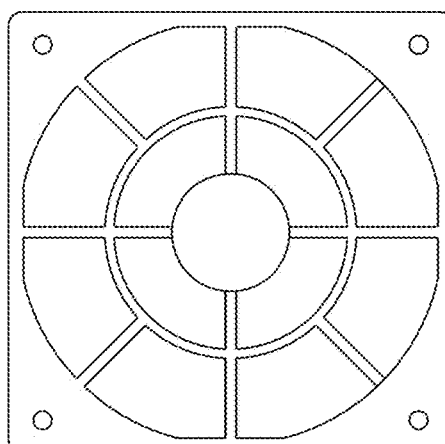
Figure 3A:
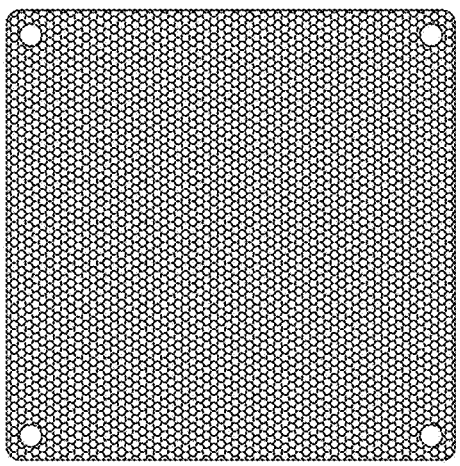
FIGS. 3A-3C are front views of known perforated-type fan covers.
Figure 3B:
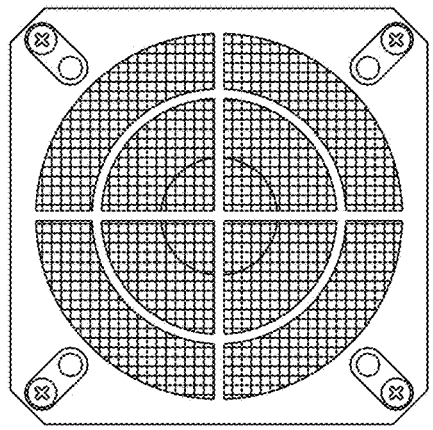
Figure 3C:
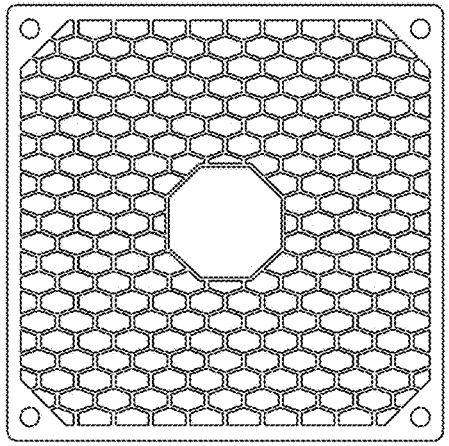
Figure 4A:
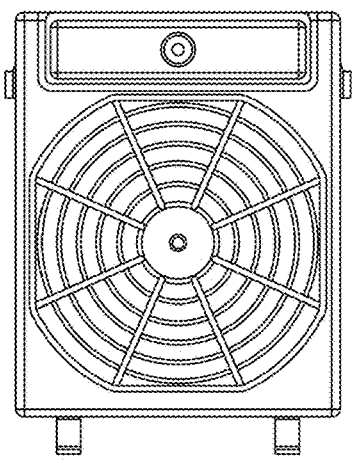
FIGS. 4A-4C are views of a known fan cover for an equipment rack.
Figure 4B:
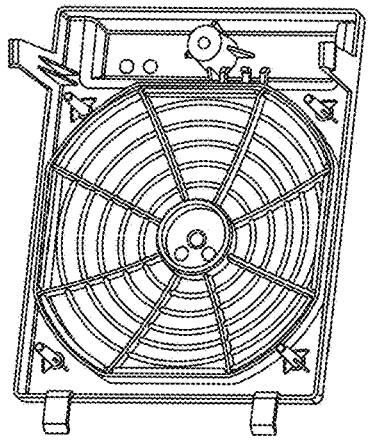
Figure 4C:
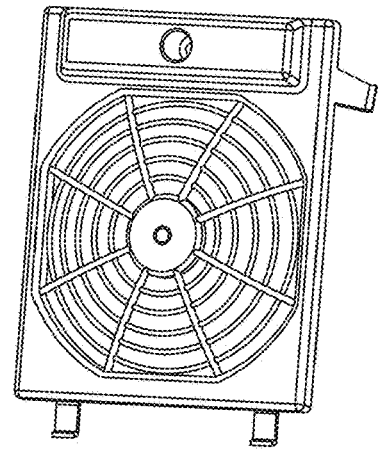
Figure 5:
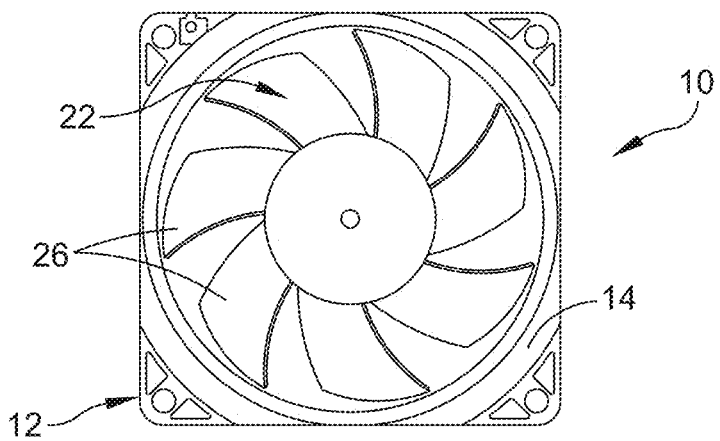
FIG. 5 is a front perspective view of a fan module.

Embodiments of equipment racks and/or cooling racks embody fan modules, such as an exemplary fan module generally indicated at 10 shown in FIG. 5, within the racks to move air within the racks. Each rack can be configured to employ multiple fan modules 10 within the rack environment. For example, within an equipment rack and/or a cooling rack, fan units are configured to draw air from the front of the rack to the back of the rack. In one embodiment, the fan module 10 may be assembled and wired within the housing of the rack such that the fan module is removed by removing fasteners and sliding the fan module out of a receptacle formed in the housing of the rack. The electrical power provided to each fan module 10 may be connected and disconnected by a suitable connector, such as a blindmate connector. The arrangement is such that the fan modules 10 are "hot swappable" based on voltage requirements as well as their easy removal from the receptacle and the blindmate connector. In some embodiments, a controller may be configured to monitor the operation of the fan so as to predict the failure of a fan based on power draw variances of the fan. The controller is also configured to control the operation of the other working components of the rack.

Figure 6:
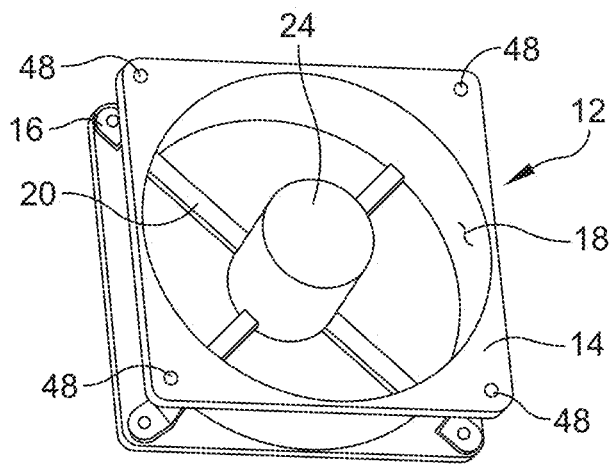
FIG. 6 is a front perspective view of a housing of the fan module.

As shown in FIGS. 5 and 6, the fan module 10 includes a generally rectangular casing or housing, generally indicated at 12, that is configured to support the components of the fan module. As best shown in FIG. 6, the housing 12 includes an outer flange 14, an inner flange 16 and a cylindrical wall 18 that connects the outer flange and the inner flange. A support structure 20 is connected to the cylindrical wall 18 to support a motor and an axial fan of the fan module. The housing 12 can be fabricated from any number of materials, including, aluminum, steel (painted or galvanized), stainless steel, and plastic. In addition, although rectangular in shape, the housing 12 of the fan module 10 can embody any size and shape depending on the intended use of the fan module.

The fan module 10 further includes an axial fan, generally indicated at 22, having a motor 24 supported by the support structure 20, and a plurality of fan blades, each indicated at 26, that extend from a housing of the motor. The motor 24 is located in the central part of the axial fan 22 and is rotatably coupled to the support structure 20 of the housing, with the housing of the motor being fabricated from aluminum, steel, stainless steel, and plastic. The motor 24 includes a motor shaft to mount the axial fan. As shown, each blade 26 is mounted on the housing of the motor 24, with the blades being dynamically balanced to prevent unwanted vibration of the axial fan 22 module during operation. The blades 26 can be made from the same materials as the housing of the motor, e.g., aluminum, steel, stainless steel, glass- and carbon-fiber composites, and the like. The blades 26 can be secured to the housing of the motor 24 at different angles, which has a direct influence on the flow characteristics of the axial fan 22. The axial fan 22 is configured to rotate in one direction, but can be configured to be reversible to rotate in clockwise and counterclockwise directions. The motor 24 can includes several speed motor or a variable speed motor to vary a rate of rotation of the axial fan 22. For example, two-speed motors combine variable operating conditions and a lower operating cost.

Figure 7:
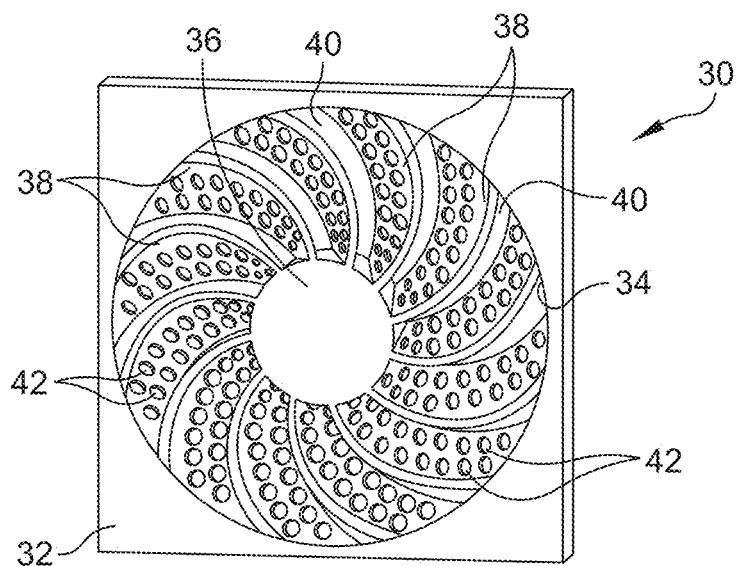
FIG. 7 is a front perspective view of a fan cover of an embodiment of the present disclosure.
Figure 8:
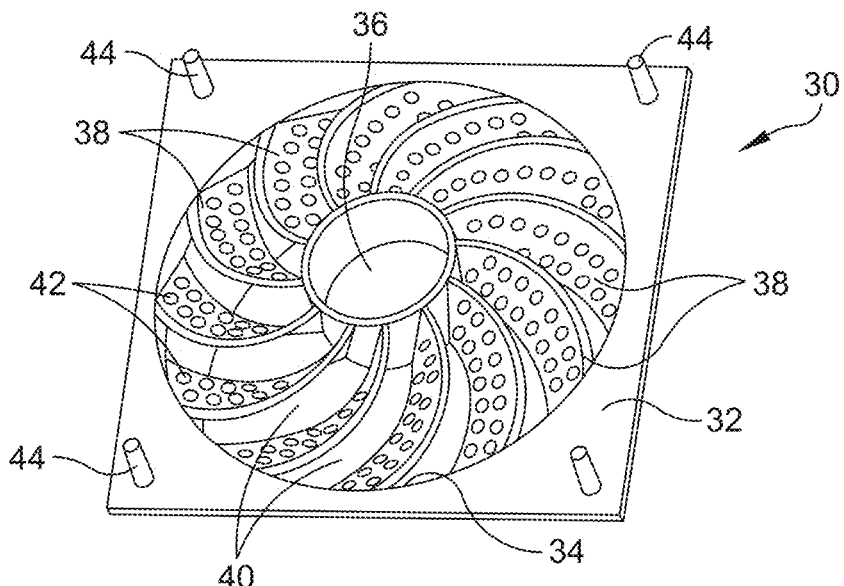
FIG. 8 is a back perspective view of the fan cover.
Figure 9:
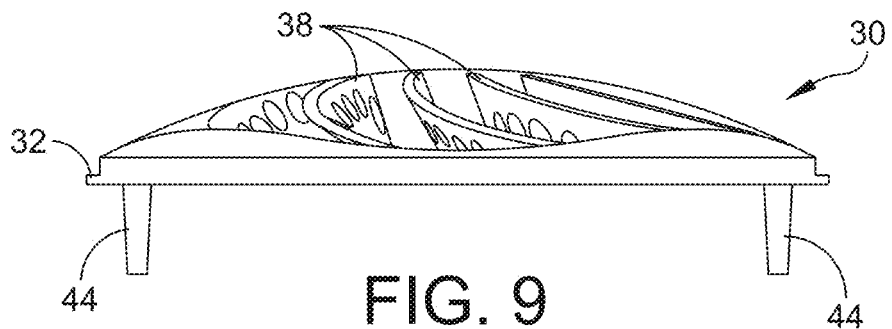
FIG. 9 is a side view of the fan cover.
Figure 10:
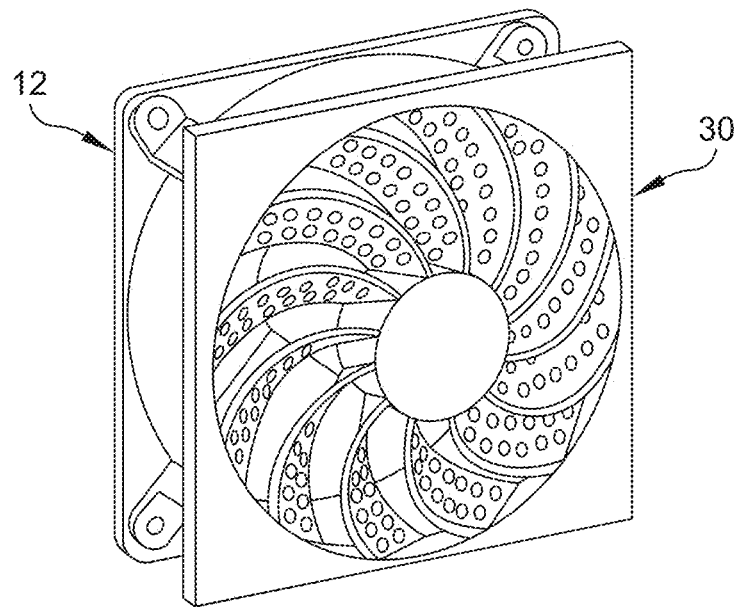
FIGS. 10-13 are views showing features provided to mount the fan cover on the fan module.
Figure 11:
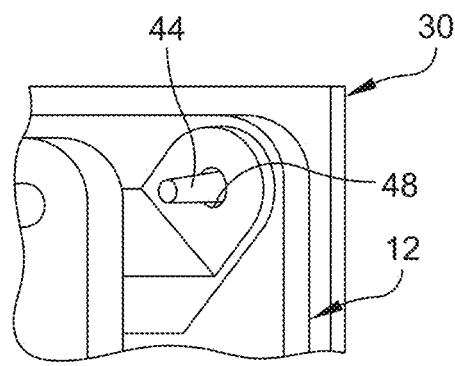
Figure 12:
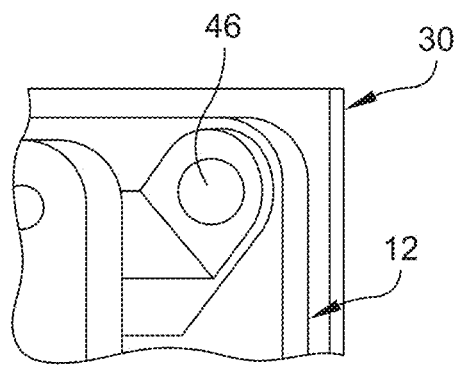

Referring to FIGS. 7-9, the fan module 10 further includes a fan cover, generally indicated at 30. As will be described in greater detail below, the fan cover 30 is configured to be mounted on the housing 12 of the fan module 10. In one embodiment, the fan cover 30 includes a frame 32 having a relatively large opening 34 formed therein. As with the housing 12 of the fan module 10, the frame 32 of the fan cover 30 can be fabricated from any number of materials, including, aluminum, steel, stainless steel, and plastic. However, preferably the fan cover 30 is fabricated from plastic material, such as a polycarbonate-siloxane copolymer.

The fan cover 30 further includes a central hub 36 positioned within the opening 34 of the frame 32 and a plurality of spiral-shaped air guidance members, each indicated at 38, that extend from the central hub to the frame. In the shown embodiment, the fan cover 30 includes twelve spiral-shaped air guidance members 38; however, any number of air guidance members can be provided and fall within the scope of the present disclosure. The arrangement is such that gaps 40 between the spiral-shaped air guidance members 38 enable air to flow from the fan module 10 through the fan cover 30. Each spiral-shaped air guidance member 38 is shaped to approximate a fan blade of the fan module. The construction of the spiral-shaped air guidance members 38 facilitate the flow of air generated by the axial fan through the gaps 40 of the fan cover 30, thereby providing more effective thermal management of the space in which the fan module 10 operates. The fan cover 30 is configured to make a thermal source cooler, which will be described below.

In a certain embodiment, each spiral-shaped air guidance member 38 extends generally perpendicularly from the central hub 36 and curves towards an outer periphery of the frame 32 at an angle with respect to the opening 34 of the frame where the air guidance member is secured to the frame. As best shown in FIG. 9, each spiral-shaped air guidance member 38 projects above a plane defined by the frame 32. As shown, the central hub 36 is elevated with respect to a plane defined by the frame 32 so that the spiral-shaped air guidance members curve upwardly in addition to curing to an outer periphery of the frame. In one embodiment, each spiral-shaped air guidance member 38 is helical in construction.

As shown in FIGS. 7 and 8, each spiral-shaped air guidance member 38 has a plurality of openings, each indicated at 42, formed therein. In the shown embodiment, each spiral-shaped guidance member 38 includes two rows or series of openings 42 that extend along a length of the air guidance member, with each guidance member having approximately 17 openings formed therein. It should be noted that any number of openings 42 or rows of openings can be provided to achieve improved airflow through the fan cover 10 described herein. These openings 42, along with the gaps 40 between the spiral-shaped air guidance members 38, further facilitate the flow of air generated by the axial fan 22 through the fan cover 30, while providing protection from a person's fingers being inserted into the fan module 10. The increased flow provided by the fan cover 30 is better understood with reference to FIGS. 14-17, which are described below.

Figure 13:
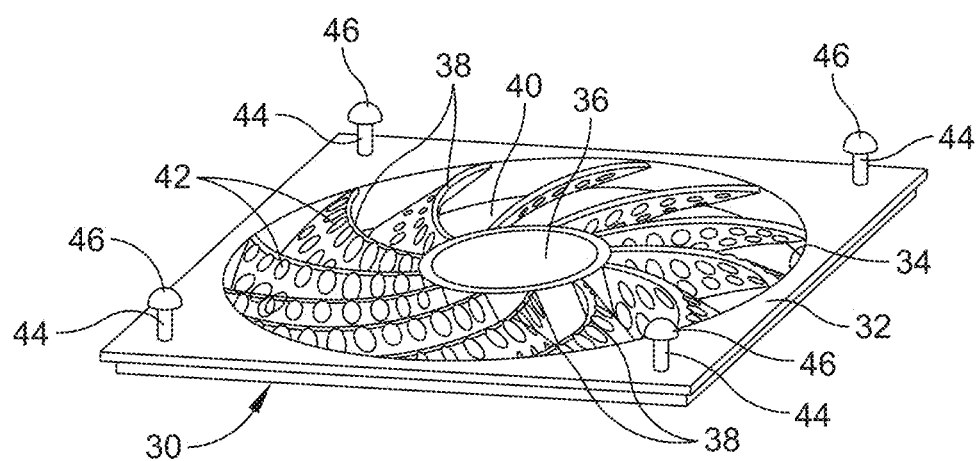

The fan cover 30 is configured to be mounted on the housing 12 of the fan module 10. In one embodiment, with reference to FIGS. 10-13, the fan cover 30 includes several, e.g., four, projections, each indicated at 44, which extend perpendicularly from the frame 32. As shown best in FIG. 13, each projection 44 includes a cylindrical shaft that is configured with a rivet head 46 to secure the fan cover 30 to the housing 12 of the fan module 10. In one embodiment, the rivet head 46 is formed by applying a large current and high resistance to an end of the projection 44 with an electric pole. The housing 12 of the fan module 10 includes several, e.g., four, installation apertures 48, to receive the projections 44 of the fan cover 30. In the shown embodiment, the outer flange 14 of the housing 12 has an aperture 48 provided at the four corners of the outer flange. The inner flange 16 is also provided with installation apertures to address the situation when the fan cover 30 is mounted on the other side of the fan module 10. Each projection 44 is received within a corresponding aperture 48 formed in the housing 12 of the fan module 10 to align and receive the fan cover 30 to the fan module. Once the projections 44 are inserted into their respective apertures 48, the rivet heads 46 are formed on the projections to secure the projections and the fan cover 30 to the housing 12 of the fan module 10.

In one embodiment, a diameter of the opening 34 of the frame 32 is larger than a fan vent of the fan module 10. Moreover, a diameter of the central hub 36 of the fan cover 30 is smaller than a diameter of the fan motor 24 of the fan module 10.

Figure 14:
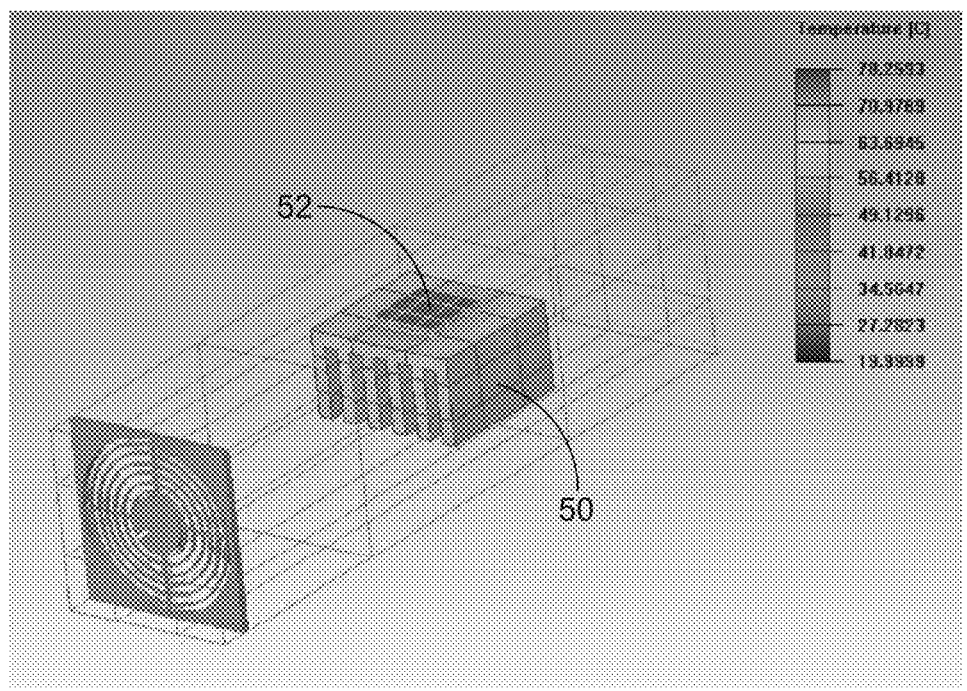
FIGS. 14-16 are graphical representations of thermal effects of prior art fan covers proximate a heat sink having an electronic package.
Figure 15:
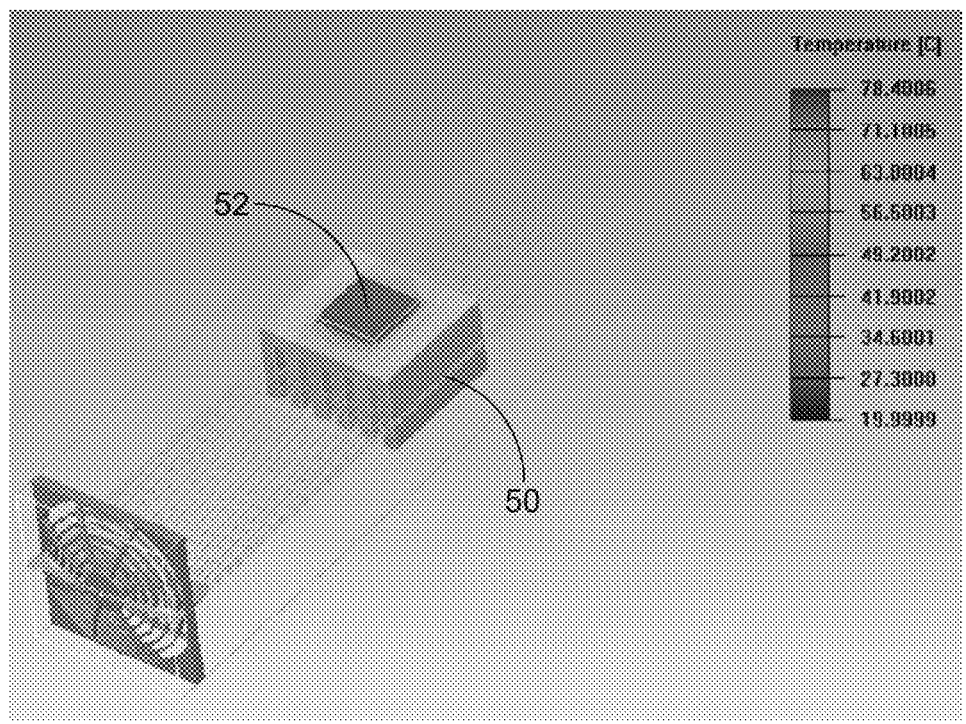
Figure 16:
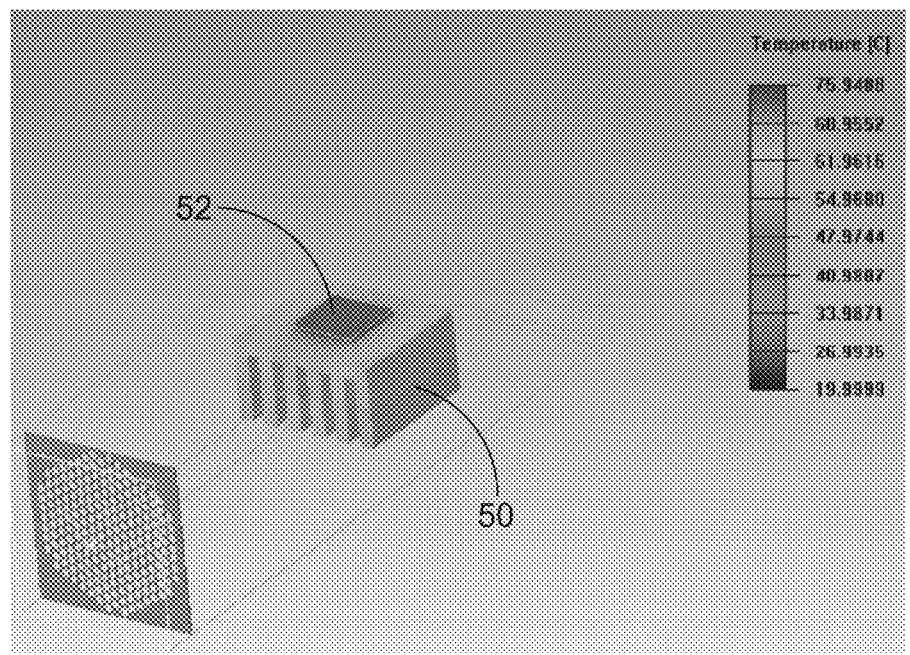
Figure 17:
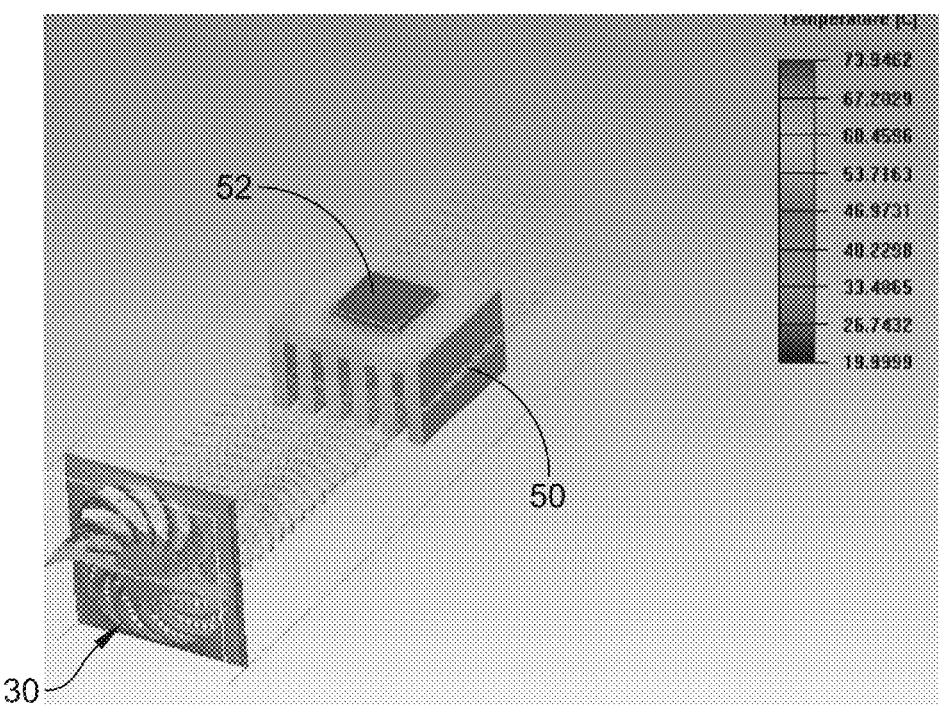
FIG. 17 is a graphical representation of the thermal effect of the fan cover of embodiments of the present disclosure proximate a heat sink having an electronic package.

Referring to FIGS. 14-17, the effectiveness of the fan cover 30 of the present disclosure as compared to prior art fan covers is represented. In these figures, a thermal source, e.g., a heat sink with an electronic package mounted thereon, is subjected to airflow provided by different types of fan covers. In the simulations, the electronic package is a 250 Watt thermal source. FIG. 14 illustrates a metal wire, grille-type fan cover. FIG. 15 illustrates a plastic grille-type fan cover. FIG. 16 illustrates a perforated-type, e.g., hex cut, fan cover. FIG. 17 illustrates a fan cover of an embodiment of the present disclosure. In the simulation, the fan cover described herein reduced the simulated temperature by more than two degrees Celsius as compared to the next effective fan cover, i.e., the perforated-type fan cover. The fan cover of an embodiment of the present disclosure makes the thermal source cooler, so as to improve thermal conditions within the equipment or cooling rack.

It is to be appreciated that embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A fan cover configured to be mounted on a housing of a fan module, the fan cover comprising:
   a frame having an opening formed therein;
   a central hub positioned within the opening of the frame; and
   a plurality of spiral-shaped air guidance members that extend from the central hub to the frame,
   wherein gaps between the spiral-shaped air guidance members of the plurality of spiral-shaped air guidance members enable air to flow from the fan module through the fan cover, and
   wherein each spiral-shaped air guidance member has a plurality of openings formed therein, each opening being configured to allow airflow through the corresponding spiral-shaped air guidance member.

2. The fan cover of claim 1, wherein each spiral-shaped air guidance member extends perpendicularly from the central hub and curves towards the frame.

3. The fan cover of claim 2, wherein each spiral-shaped air guidance member projects above a plane defined by the frame.

4. The fan cover of claim 3, wherein the each spiral-shaped air guidance member is helical in construction.

5. The fan cover of claim 1, further comprising a plurality of projections extending from the frame, the plurality of projections each being received within a corresponding aperture formed in the housing of the fan module to align and receive the fan cover to the fan module.

6. The fan cover of claim 5, wherein the plurality of projections includes four projections.

7. The fan cover of claim 1, wherein a diameter of the opening of the frame is larger than a fan vent of the fan module.

8. The fan cover of claim 1, wherein a diameter of the central hub is smaller than a diameter of a fan motor of the fan module.

9. The fan cover of claim 1, wherein the fan cover is fabricated from plastic material.

10. The fan cover of claim 1, wherein each spiral-shaped air guidance member is configured to facilitate the flow of air generated by the axial fan through the gaps of the fan cover.

11. The fan cover of claim 1, wherein the fan cover is configured to direct air toward a thermal source.

12. A fan module comprising:
    a housing;
    an axial fan coupled to the housing;
    a motor coupled to the axial fan to drive a rotation of the axial fan; and
    a fan cover configured to be mounted on, the fan cover including
      a frame having an opening formed therein, the frame being configured to be secured to the housing,
      a central hub positioned within the opening of the frame, and
      a plurality of spiral-shaped air guidance members that extend from the central hub to the frame,
      wherein gaps between the spiral-shaped air guidance members of the plurality of spiral-shaped air guidance members enable air to flow from the fan module through the fan cover, and
      wherein each spiral-shaped air guidance member has a plurality of openings formed therein, each opening being configured to allow airflow through the corresponding spiral-shaped air guidance member.

13. The fan module of claim 12, wherein each spiral-shaped air guidance member extends perpendicularly from the central hub and curves towards the frame.

14. The fan module of claim 13, wherein each spiral-shaped air guidance member projects above a plane defined by the frame.

15. The fan module of claim 12, further comprising a plurality of projections extending from the frame, the plurality of projections each being received within a corresponding aperture formed in the housing of the fan module to align and receive the fan cover to the fan module.

16. The fan module of claim 15, wherein the plurality of projections includes four projections.

17. The fan module of claim 16, wherein each projection includes a shaft and a rivet head that is formed on the shaft.

18. The fan module of claim 12, wherein a diameter of the central hub is smaller than a diameter of the motor of the fan module.

* * * * *

UNITED STATES PATENT AND TRADEMARK OFFICE
CERTIFICATE OF CORRECTION

| | | |
|---|---|---|
| PATENT NO. | : 11,280,352 B2 | Page 1 of 1 |
| APPLICATION NO. | : 16/801719 | |
| DATED | : March 22, 2022 | |
| INVENTOR(S) | : Zhang | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 72 days.

Signed and Sealed this
Twentieth Day of December, 2022

*Katherine Kelly Vidal*

Katherine Kelly Vidal
*Director of the United States Patent and Trademark Office*